(12) United States Patent  
Lin et al.

(10) Patent No.: US 7,742,119 B2
(45) Date of Patent: Jun. 22, 2010

(54) PIXEL STRUCTURE HAVING TWO TFTS CONNECTED TO PIXEL ELECTRODE, SECOND TFT HAVING FLOATING MAIN GATE ELECTRODE AND TOP GATE ELECTRODE, WITH REPAIR METHOD CONNECTING THE GATE ELECTRODES OF THE TWO TFTS

(75) Inventors: Chun-An Lin, Taoyuan (TW); Chien-Kuo He, Taoyuan (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 247 days.

(21) Appl. No.: 11/759,630

(22) Filed: Jun. 7, 2007

(65) Prior Publication Data
US 2008/0116501 A1 May 22, 2008

(30) Foreign Application Priority Data
Nov. 17, 2006 (TW) .............................. 95142669 A

(51) Int. Cl.
*G02F 1/136* (2006.01)
*G02F 1/1343* (2006.01)
*G02F 1/1333* (2006.01)
*G09G 3/36* (2006.01)
*G02F 1/13* (2006.01)

(52) U.S. Cl. .............................. 349/55; 349/46; 349/48; 349/54; 349/192; 345/93

(58) Field of Classification Search .................... 349/55, 349/46, 54, 192, 48; 345/93; 257/59, 72
See application file for complete search history.

(56) References Cited

U.S. PATENT DOCUMENTS

| 5,062,690 | A | * | 11/1991 | Whetten | 349/55 |
| 5,367,392 | A | * | 11/1994 | Janai | 349/55 |
| 6,614,494 | B2 | | 9/2003 | Kawai et al. | |
| 2004/0114059 | A1 | * | 6/2004 | Lee et al. | 349/39 |
| 2005/0099377 | A1 | * | 5/2005 | Kim | 345/98 |
| 2007/0252146 | A1 | * | 11/2007 | Yokomizo | 257/59 |

FOREIGN PATENT DOCUMENTS

| CN | 1638569 | 7/2005 |
| JP | 5-30-3114 | 11/1993 |
| JP | 7-104311 | 4/1995 |
| JP | 11-305260 | 11/1999 |

* cited by examiner

*Primary Examiner*—Andrew Schechter
*Assistant Examiner*—Michael Inadomi
(74) *Attorney, Agent, or Firm*—Jianq Chyun IP Office

(57) ABSTRACT

A pixel structure includes a backup thin film transistor with a float gate electrode or a float drain electrode and a working thin film transistor. When the pixel of the working thin film transistor does not work, the backup thin film transistor replaces the working thin film transistor to drive the pixel. The method of repairing the pixel is to cut off the connection between the drain electrode of the working thin film transistor and the pixel electrode, and then to connect the main gate electrode or the drain electrode of the backup thin film transistor to the gate electrode or the drain electrode of the working thin film transistor, such that the backup thin film transistor can replace the working thin film transistor to drive the pixel electrode.

3 Claims, 6 Drawing Sheets

PIXEL STRUCTURE HAVING TWO TFTS CONNECTED TO PIXEL ELECTRODE, SECOND TFT HAVING FLOATING MAIN GATE ELECTRODE AND TOP GATE ELECTRODE, WITH REPAIR METHOD CONNECTING THE GATE ELECTRODES OF THE TWO TFTS

1. FIELD OF THE INVENTION

This invention relates to a pixel structure and repair method thereof, and, more especially, to utilize a backup thin film transistor to repair a defective pixel structure and its method.

2. BACKGROUND OF THE RELATED ART

In general, to repair a defective pixel of a thin film transistor liquid crystal display (TFT LCD), a bright point of the pixel is often converted to a dark point or a gray point, but this pixel is still a permanent defective pixel.

FIG. 1 shows the conventional equivalent circuit of a pixel structure to explain the circuit of a TFT LCD. As shown in this figure, for a pixel, the gate electrode 410 electrically connects to a scan line 200, the source electrode 420 electrically connects to a data line 100 and the drain electrode 430 electrically connects to a pixel electrode 300.

FIG. 2 is the conventional equivalent circuit of a repaired pixel, which is repaired into a dark point. The drain electrode 430 of the pixel is shortened at a repair point 510 to electrically connect to a scan line 200. Since the pixel electrode 300 is electrically connected to the scan line 200 directly, the defective pixel shows a dark point.

FIG. 3 is the equivalent circuit of a repaired pixel, which is repaired into a gray point. The drain electrode 430 of the pixel is shortened at a repair point 520 to electrically connect to a data line 100. Since the pixel electrode 300 is electrically connected to the data line 100 directly, the defective pixel becomes a gray point.

However, the dark point or the gray point, which is still a defect of a TFT LCD, influences display performance. Furthermore, a bright point is a critical defect for a TFT LCD, so it is repaired into a dark point or a gray point. However, the display performance of a TFT LCD is still not significantly improved because of the permanent existence of a defective pixel. So, how to repair a defective pixel into a normal pixel and to prevent the defect is an important technique.

SUMMARY OF THE INVENTION

For solving the abovementioned problems, this invention provides a pixel structure, which utilizes a backup thin film transistor (TFT) for repairing a defective pixel. Moreover, the backup TFT has a top gate electrode to hold the driven power to improve the space efficiency, so it will not affect the aperture ratio of the TFT LCD.

This invention further provides a method of repairing a defective pixel. It utilizes a backup TFT to replace the TFT of a defective pixel instead of transforming the defective point to a dark point or a gray point.

For achieving the abovementioned and other objects, this invention provides a pixel structure disposed on a substrate. The pixel structure includes a data line, a scan line, a first TFT, a second TFT, a pixel electrode and a pattern. The scan line and the data line are arranged on the substrate. The first TFT includes a gate electrode, a source electrode and a drain electrode, and the second TFT includes a main gate electrode, a source electrode and a drain electrode. For the first TFT, the gate of the first TFT is electrically connected to the scan line, and the source electrode to the data line, and the drain electrode to the pixel electrode via a first contact hole. For the second TFT, the main gate electrode of the second TFT is floating, and the source electrode is electrically connected to the data line and the drain electrode to the drain electrode of the first TFT. The pattern is designed at the layer of the source and drain electrodes of the first and the second TFTs, and its two ends, designed as the repair points, overlap the gate electrode of the first TFT and the main gate electrode of the second TFT in space.

The method of repairing a defective pixel is to cut off the pixel electrode and the drain electrode of the first TFT, and then to electrically connect the pattern with the gate electrode-of the first TFT and the main gate electrode of the second TFT when the pixel is damaged, so the second TFT will drive the pixel instead of the first TFT.

For achieving the abovementioned and other objects, this invention provides a pixel structure disposed on a substrate. The pixel structure includes a data line, a scan line, a first TFT, a second TFT, a pixel electrode and a pattern. The scan line and the data line are arranged on the substrate. The first TFT includes a gate electrode, a source electrode and a drain electrode, and the second TFT includes a main gate electrode, a source electrode and a drain electrode. For the first TFT, the gate of the first TFT is electrically connected to the scan line, and the source electrode to the data line, and the drain electrode to the pixel electrode via a first contact hole. For the second TFT, the main gate electrode of the second TFT is electrically connected to the scan line, and the source electrode is electrically connected to the data line and the drain electrode is floating. The pattern is designed at the layer of the gate electrode of the first TFT and the main gate electrode of the second TFT, and its two ends, designed as the repair points, overlap the drain electrodes of the first and second TFTs.

The method of repairing a defective pixel is to cut off the pixel electrode and the drain electrode of the first TFT, and then to electrically connect the pattern with the drain electrodes of the first and the second TFTs when the pixel is damaged, so the second TFT will drive the pixel instead of the first TFT.

For preserving the driving power of the pixel electrode to improve the space efficiency, the second TFT is designed as a double-gate TFT. In the second TFT, a top gate electrode is opposite to the main gate electrode at the layer of the pixel electrode, and the top gate electrode is electrically connected to the main gate electrode via a second contact hole.

DETAILED DESCRIPTION OF THE INVENTION

The pixel structure of a thin film transistor liquid crystal display (TFT LCD) is disposed on a substrate, where the substrate includes a plurality of data lines and crossing scan lines to define a plurality of pixel regions. Each of those pixel regions includes a first TFT, a second TFT, a pixel electrode and a repair pattern. The first TFT includes a gate electrode, a source electrode, and a drain electrode, and the second TFT includes a main gate electrode, a source electrode and a drain electrode. Those data lines and scan lines are configured to drive the first thin film transistor and the second thin film transistor. In the first TFT, the drain electrode is electrically connected to the pixel electrode and the gate electrode to the scan line and the source electrode to the data line. In the second TFT, the drain electrode or the main gate electrode is floating, but the source electrode is electrically connected to the data line.

Once a pixel is damaged, the repair method is to cut off the pixel electrode and the drain electrode of the first TFT and then to electrically connect the gate electrodes or the drain electrodes of the first and the second TFTs. Therefore, the second TFT will drive the pixel electrode instead of the first TFT to repair the defective pixel. The laser cutting method is generally employed in cutting off the connection between the drain electrode of the first TFT and pixel electrode, and the laser welding method is employed in connecting the connection between the gate electrodes or the drain electrodes of the first and the second TFTs.

For improving the space efficiency due to the area occupied by the second TFT and keeping the driving power of the pixel electrode, a top gate electrode is designed, where the top gate is designed opposite to the main gate electrode of the second TFT at the layer of the pixel electrode. The top gate electrode is electrically connected to the main gate electrode of the second TFT such that the current channel may be enlarged to preserve the driving power, wherein the top gate electrode may be a transparent electrode, which is configured at the same layer and formed at the same time as the pixel electrode.

For understanding this invention, the following utilizes different embodiments accompanying drawings to illustrate the spirit of this invention.

Figure 1:
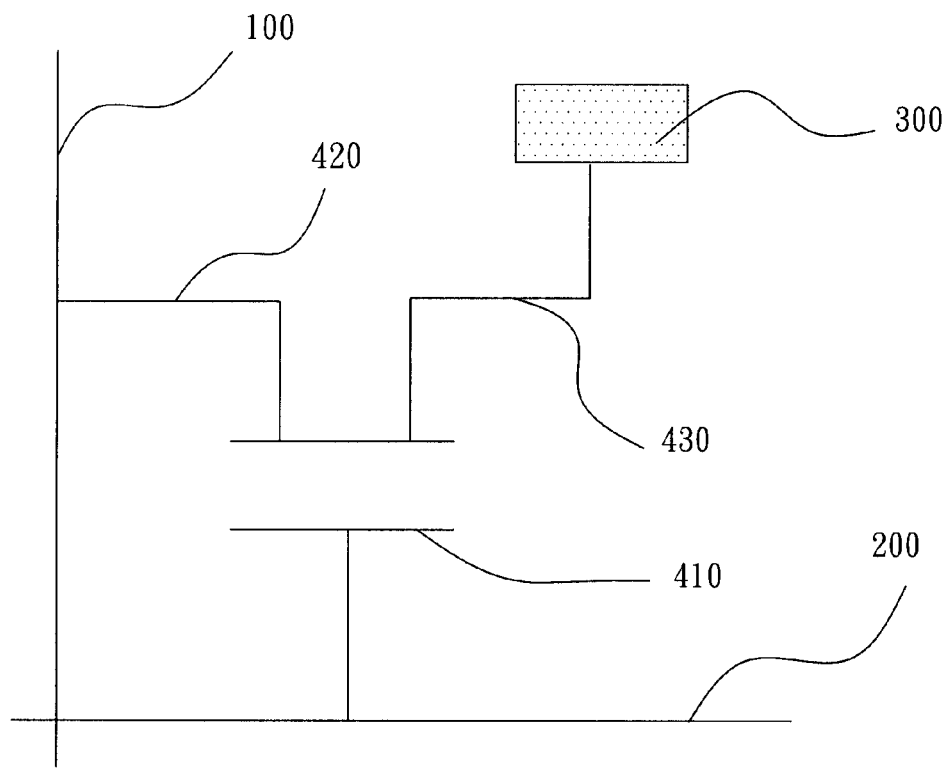
FIG. 1 is a diagram showing an equivalent circuit of a conventional pixel structure.
Figure 2:
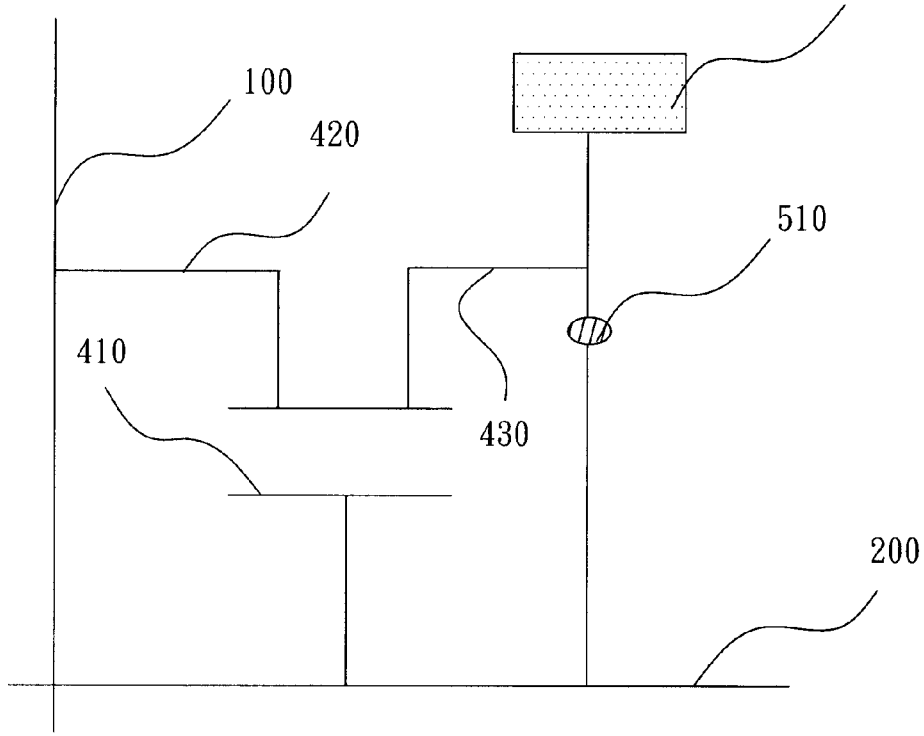
FIG. 2 is a diagram showing an equivalent circuit of a conventional dark-repaired pixel structure.
Figure 3:
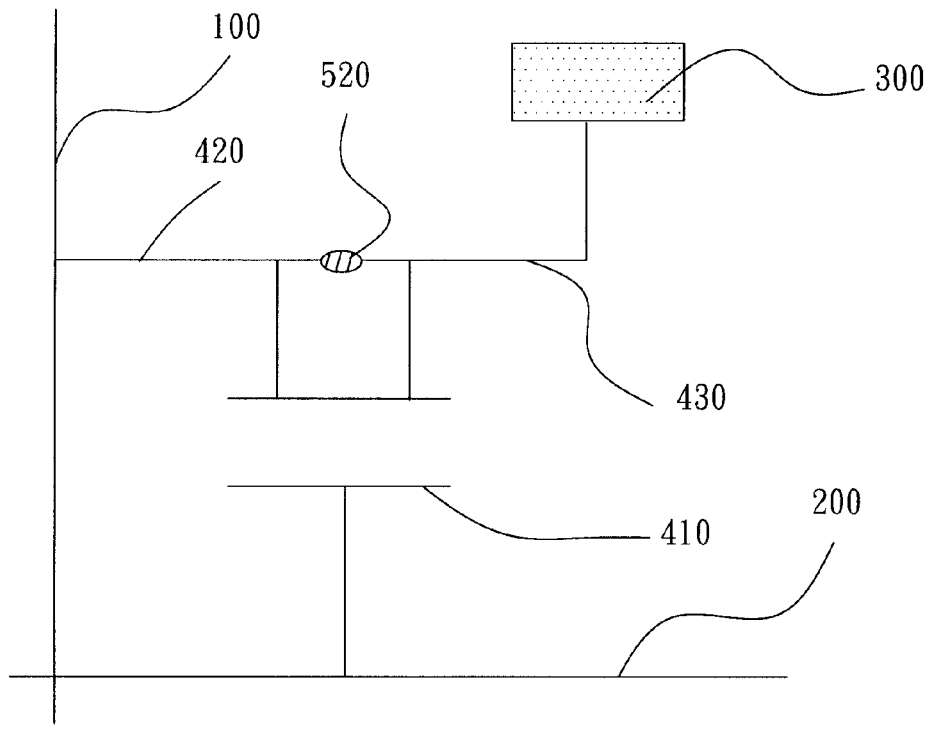
FIG. 3 is a diagram showing an equivalent circuit of a conventional gray-repaired pixel structure.
Figure 4:
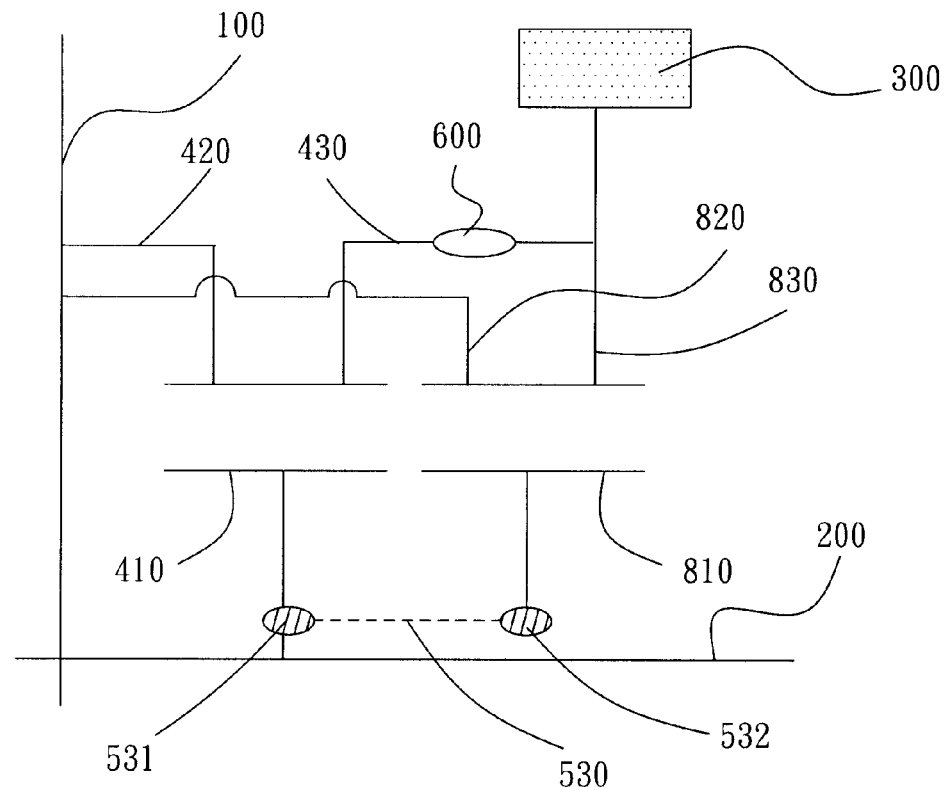
FIG. 4 is a diagram showing an equivalent circuit of a pixel structure according to the first embodiment of this invention.

FIG. 4 shows the equivalent circuit of a pixel structure according to the first embodiment of this invention. The gate electrode 410 of a first TFT is electrically connected to a scan line 200, and the source electrode 420 to a data line 100, and the drain electrode 430 to a pixel electrode 300. For a second TFT, its main gate electrode 810 is a float electrode, and its source electrode 820 is electrically connected to the data line 100, and its drain electrode 830 to the pixel electrode 300. A repair pattern 530 is designed at the layer of the source electrode 820 and the drain electrode 830 of the second TFT, and its two ends, defined repair points 531, 532, overlap the gate electrode 410 of the first TFT and the main gate electrode of the second TFT.

For repairing, the connection between the drain electrode 430 of the first TFT and the pixel electrode 300 is severed at a cutting point 600. Next, the repair pattern 530 is electrically connected to the gate electrode 410 of the first TFT via the repair point 531 and to the main gate electrode 810 of the second TFT via the repair point 532.

Figure 5:
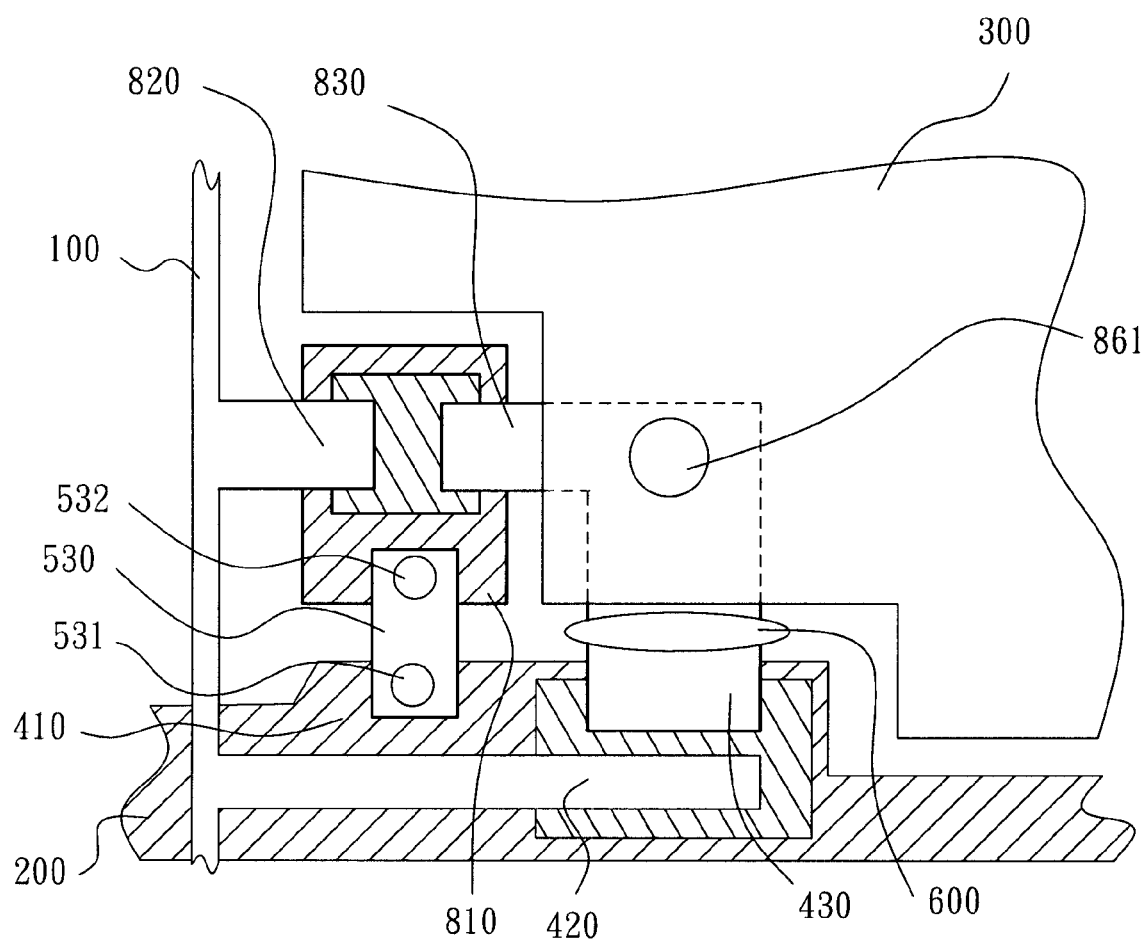
FIG. 5 is a diagram showing the top view of a pixel structure according to the first embodiment of this invention.

FIG. 5 is a schematic diagram showing the top view of the pixel structure of the first embodiment. As shown in the figure, for the second TFT, its main gate electrode 810 is a float electrode, and its source electrode 820 is electrically connected to the data line 100, and its drain electrode 830 to the pixel electrode 300 via a first contact hole 861. For the first TFT, its gate electrode 410 is electrically connected to the scan line 200, and its source electrode 420 to the data line 100, and its drain electrode 430 to the pixel electrode 300 via a first contact hole (CH) 861, and the drain electrode extends to form the drain electrode 830 of the second TFT.

The cutting point 600 is defined on the drain electrode 430 that is positioned above the gap between the gate electrode 410 and the pixel electrode 300. The repair pattern 530 is designed at the layer of the source electrodes 420, 820 and the drain electrodes 430, 830, and its two ends, which are defined as the repair point 531 and the repair point 532, overlap the gate electrode 410 of the first TFT and the main gate electrode of the second TFT respectively.

Once a pixel is damaged, a laser cutting method is employed to cut the connection between the drain electrode 430 of the first TFT and the pixel electrode 300 at the cutting point 600, and then a laser welding method is employed to connect the repair points 531, 532 of the repair pattern 530 with the gate electrode 410 of the first TFT and the main gate electrode of the second TFT respectively, such that the second TFT will replace the first TFT to drive the pixel electrode 300.

Figure 6:
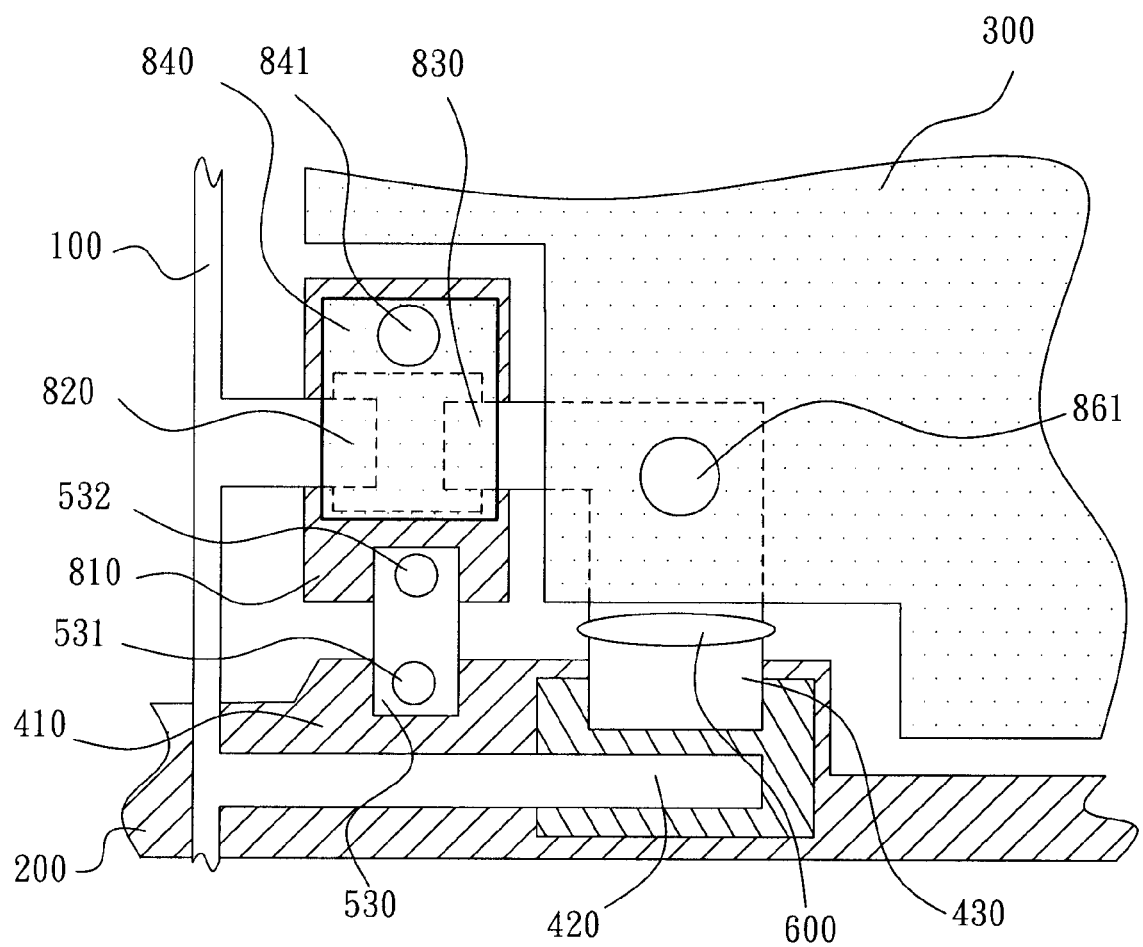
FIG. 6 is a diagram showing the top view of a pixel structure according to the second embodiment of this invention.

FIG. 6 is the top view of a schematic diagram showing the pixel structure of a second embodiment according to this invention. It differs from the first embodiment in that the second TFT is a double-gate-electrode TFT. A top gate electrode 840 is designed opposite to the main gate electrode 810 at the layer of the pixel electrode 300. Furthermore, the top gate electrode 840 is electrically connected to the main gate electrode 810 via a second contact hole 841.

Figure 7:
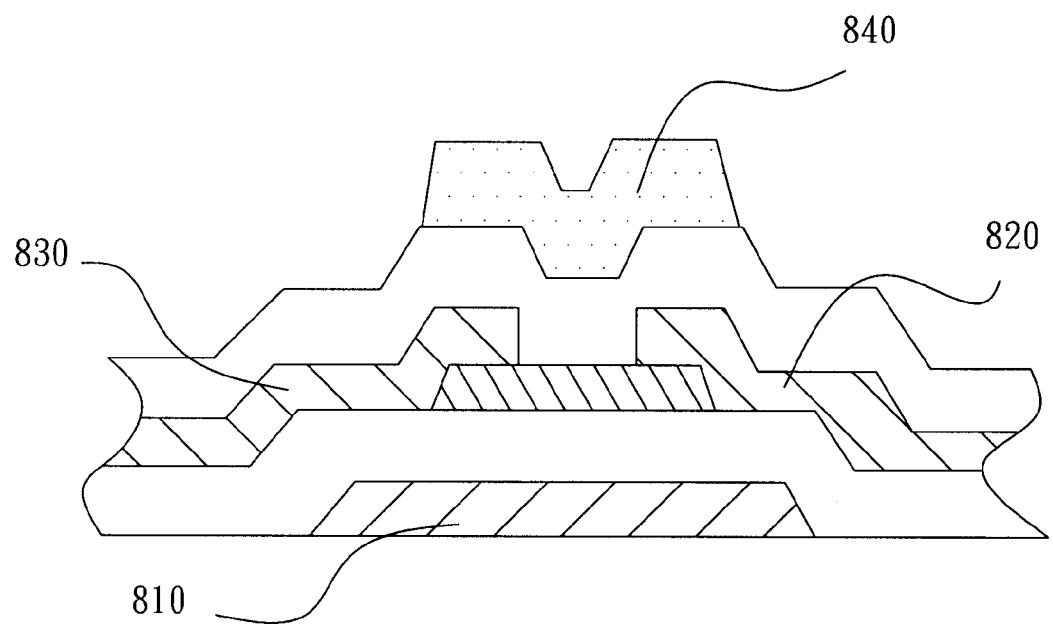
FIG. 7 is a diagram showing the sectional view of a pixel structure according to the second embodiment of this invention.

FIG. 7 is a sectional diagram showing the structure of the second TFT in the second embodiment. As shown in the figure, the second TFT includes the top gate electrode 840 and the main gate electrode 810, and these two gate electrodes are electrically connected to induce a larger current channel to keep the driving power of the pixel electrode 300.

Figure 8:
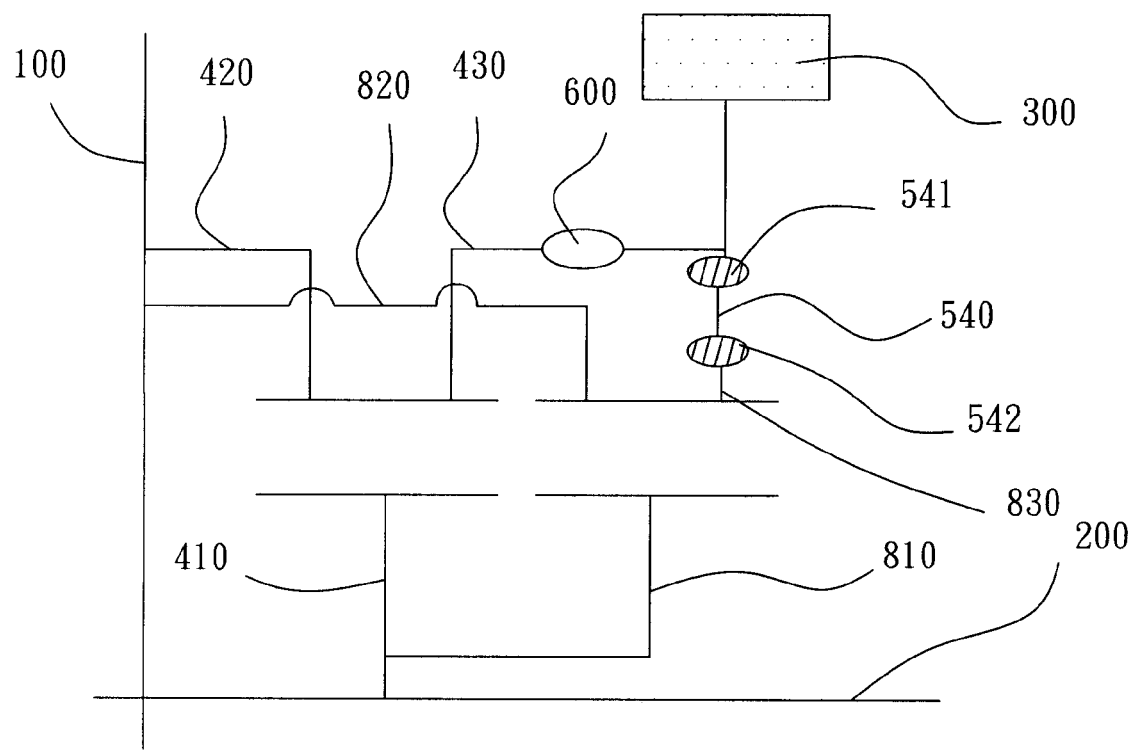
FIG. 8 is a diagram showing an equivalent circuit of a pixel structure according to the third embodiment of this invention.

FIG. 8 shows the equivalent circuit of the pixel structure according the third embodiment of this invention. For the first TFT, its main gate electrode 410 is electrically connected to a scan line 200, and its source electrode 420 to a data line 100, and its drain electrode 430 to a pixel electrode 300. For the second TFT, its main gate electrode 810 is electrically connected to the scan line 200, and its source electrode 820 to the data line 100, and its drain electrode 830 is a float electrode, and a repair pattern 540 is designed. The repair method is to cut off the drain electrode 430 of the first TFT and the pixel electrode 300 at the cutting point 600, and then to electrically connect the drain electrodes 430, 830 of the first and the second TFTs to the repair points 541, 542, such that the second TFT will replace the first TFT to drive the pixel electrode 300.

Figure 9:
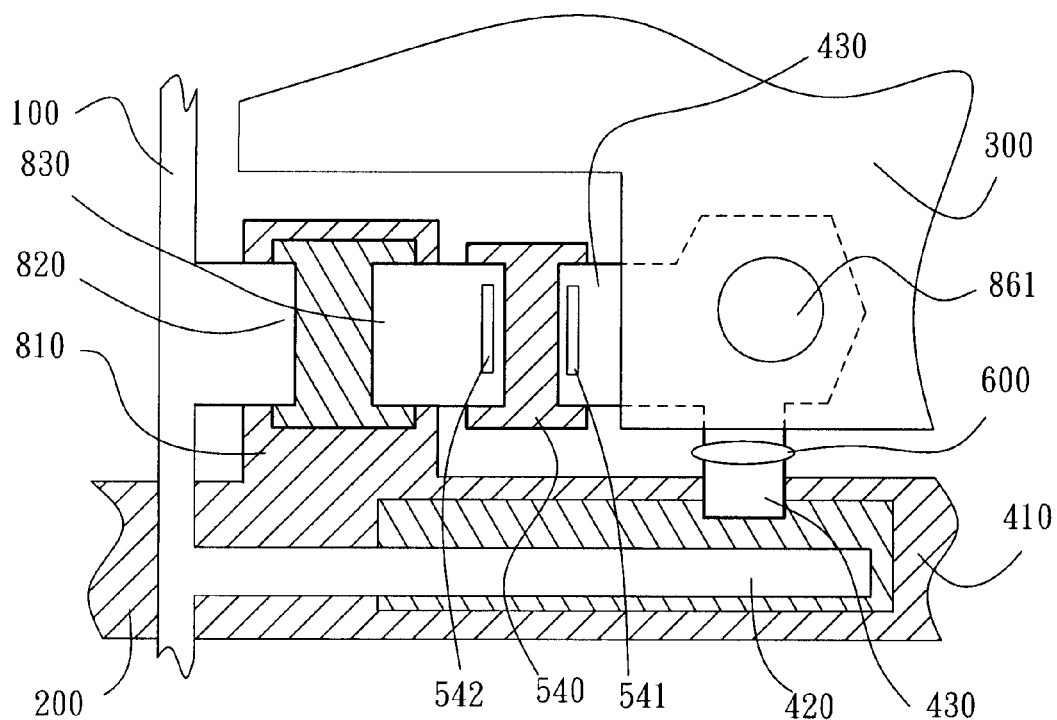
FIG. 9 is a diagram showing the top view of a pixel structure according to the third embodiment of this invention.

FIG. 9 is a schematic diagram showing the top view of a pixel structure of the third embodiment. As shown in the figure, for the second TFT, its main gate electrode 810 is electrically connected to the scan line 200, and its source electrode 820 to the data line 100, and its drain electrode 830 is a float electrode. For the first TFT, its gate electrode 410 is electrically connected to the scan line 200, and its source electrode 420 to the data line 100, and its drain electrode 430 to the pixel electrode 300 via a first contact hole 861.

The cutting point 600 is defined on the drain electrode 430 that is positioned above the gap between the gate electrode 410 and the pixel electrode 300. The repair pattern 540 is designed at the layer of the gate electrode 410 and the main gate electrode 810, and its two ends, defined as the repair points 541, 542, overlap the drain electrodes 430, 830 of the first and the second TFTs in space respectively.

Figure 10:
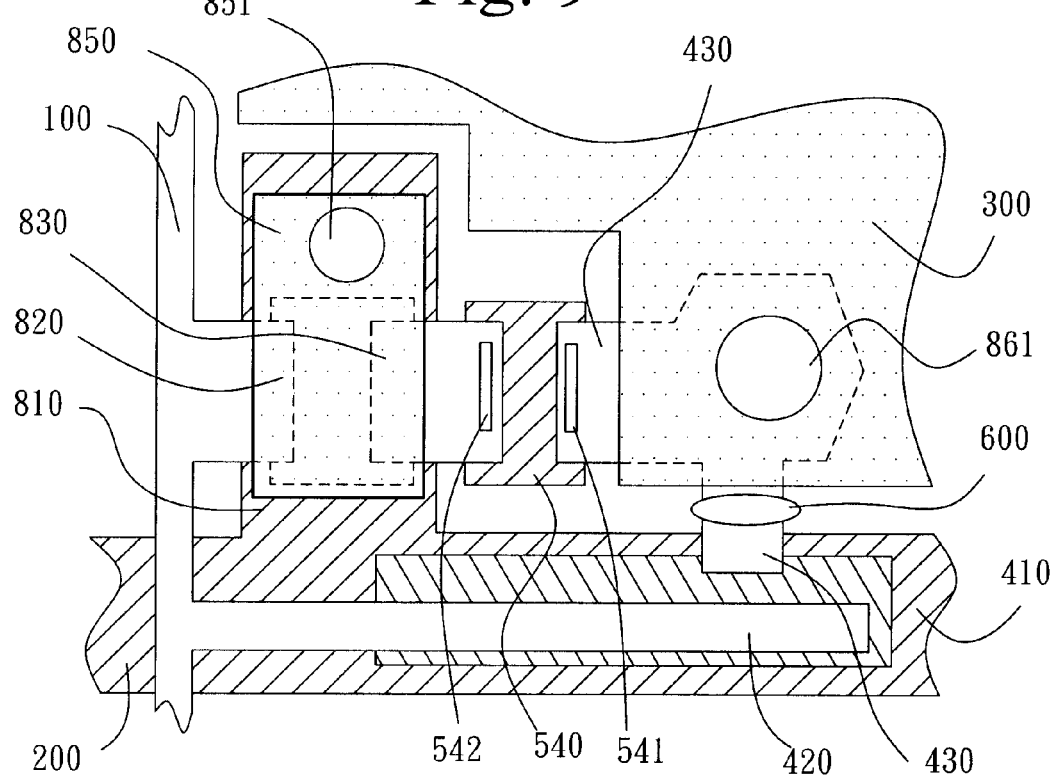
FIG. 10 is a diagram showing the top view of a pixel structure according to the fourth embodiment of this invention.

FIG. 10 is the top view of a schematic diagram showing the pixel structure of a fourth embodiment according to this invention. It differs from the third embodiment in that the second TFT is a double-gate-electrode TFT. A top gate electrode 850 is designed opposite to the main gate electrode 810 at the layer of the pixel electrode 300. Furthermore, the top gate electrode 850 is electrically connected to the main gate electrode 810 via a second contact hole 851.

As mentioned above, the repair method of the third and the fourth embodiments is similar with that of the first and the second embodiments. The laser cutting method is employed to cut off the drain electrode 430 of the first TFT and the pixel electrode 300 at cutting point 600, and then the laser welding method to connect the drain electrode 430 of the first TFT and the drain electrode 830 of the second TFT to the repair pattern 540 at repair points 541, 542 respectively, such that the second TFT will replace the first TFT to drive the pixel electrode 300.

Although the invention has been explained in relation to its embodiments, it is to be understood that other modifications and variation can be made without departing the spirit and scope of the invention as claimed.

What is claimed is:

1. A pixel structure, disposed on a substrate, the pixel structure comprising:
    a scan line and a data line arranged on the substrate;
    a first thin film transistor disposed on the substrate, wherein the first thin film transistor comprises a gate electrode electrically connected to the scan line, a source electrode electrically connected to the data line and a drain electrode;
    a second thin film transistor disposed on the substrate, wherein the second thin film transistor comprises a main gate electrode, a source electrode electrically connected to the data line and a drain electrode electrically connected to the drain electrode of the first thin film transistor, and the main gate electrode of the second thin film transistor is floating;
    a pixel electrode disposed on the substrate and electrically connected to the drain electrodes of the first and the second thin film transistors via a first contact hole; and
    a pattern designed at the layer of the source electrodes and the drain electrodes of the first and the second thin film transistors, wherein two ends of the pattern cross over the gate electrode of the first thin film transistor and the main gate electrode of the second thin film transistor respectively, and the designed pattern is separated from the source electrode of the second thin film transistor and the drain electrode of the second thin film transistor, wherein the second thin film transistor further comprises a top gate electrode opposite to the main gate electrode of the second thin film transistor at the layer of the pixel electrode, and the top gate electrode is electrically connected to the main gate electrode of the second thin film transistor.

2. The pixel structure according to claim 1, wherein the top gate electrode is electrically connected to the main gate electrode of the second thin film transistor via a second contact hole.

3. The pixel structure according to claim 1, wherein the top gate electrode is a transparent electrode.

* * * * *